United States Patent
Huang et al.

(10) Patent No.: US 11,393,373 B2
(45) Date of Patent: Jul. 19, 2022

(54) GATE DRIVE CIRCUIT AND DRIVE METHOD THEREOF, DISPLAY DEVICE AND CONTROL METHOD THEREOF

(71) Applicants: Chengdu BOE Optoelectronics Technology Co., Ltd., Sichuan (CN); BOE Technology Group Co., Ltd., Beijing (CN)

(72) Inventors: Yao Huang, Beijing (CN); Weiyun Huang, Beijing (CN); Chao Zeng, Beijing (CN)

(73) Assignees: Chengdu BOE Optoelectronics Technology Co., LTD., Sichuan (CN); BOE Technology Group Co., LTD., Beijing (CN)

( * ) Notice: Subject to any disclaimer, the term of this patent is extended or adjusted under 35 U.S.C. 154(b) by 0 days.

(21) Appl. No.: 16/954,607

(22) PCT Filed: Dec. 16, 2019

(86) PCT No.: PCT/CN2019/125725
§ 371 (c)(1),
(2) Date: Jun. 17, 2020

(87) PCT Pub. No.: WO2020/155895
PCT Pub. Date: Aug. 6, 2020

(65) Prior Publication Data
US 2021/0217341 A1 Jul. 15, 2021

(30) Foreign Application Priority Data
Jan. 31, 2019 (CN) .......................... 201910100319.4

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0286* (2013.01); *G09G 2310/08* (2013.01)

(58) Field of Classification Search
CPC ............ G09G 3/20; G09G 2310/0286; G09G 2310/08; G11C 19/28
See application file for complete search history.

(56) References Cited

U.S. PATENT DOCUMENTS

2012/0032615 A1  2/2012  Kikuchi et al.
2013/0271501 A1* 10/2013 Yang .................... G09G 3/3233
                                                       345/690
(Continued)

FOREIGN PATENT DOCUMENTS

CN      102428521 A      4/2012
CN      105139798 A      12/2015
(Continued)

OTHER PUBLICATIONS

International search report of PCT application No. PCT/CN2019/125725 dated Mar. 19, 2020.
(Continued)

*Primary Examiner* — Sejoon Ahn
(74) *Attorney, Agent, or Firm* — Fay Sharpe LLP

(57) ABSTRACT

A gate drive circuit includes: a plurality of cascaded shift register units, wherein each of the shift register units is connected to pixel circuits in a display panel; an output module of each shift register unit includes: a drive transistor for driving an output terminal to output a gate drive signal, and the output terminal is configured to provide the gate drive signal to the pixel circuits connected to the shift register unit provided with the output terminal; each pixel circuit is further connected to a first power supply terminal, and each pixel circuit is configured to emit light under control of the gate drive signal from the corresponding shift (Continued)

register unit and a first power supply signal from the first power supply terminal; and a width-to-length ratio of a conductive channel of each drive transistor is in negative correlation with a target distance.

20 Claims, 8 Drawing Sheets

(56) References Cited

U.S. PATENT DOCUMENTS

| | | | |
|---|---|---|---|
| 2017/0178583 A1 | 6/2017 | Zhang et al. | |
| 2017/0337862 A1 | 11/2017 | Geng et al. | |
| 2019/0164260 A1* | 5/2019 | Lee | G09G 3/3233 |
| 2019/0164467 A1* | 5/2019 | Seo | G09G 3/3677 |
| 2019/0378457 A1 | 12/2019 | Shen et al. | |
| 2020/0013473 A1 | 1/2020 | Xuan et al. | |
| 2020/0074944 A1* | 3/2020 | Kang | G09G 3/3607 |
| 2020/0074950 A1* | 3/2020 | Ji | G09G 3/3677 |
| 2020/0082777 A1* | 3/2020 | Guan | G09G 3/3677 |

FOREIGN PATENT DOCUMENTS

| | | |
|---|---|---|
| CN | 105590601 A | 5/2016 |
| CN | 106910453 A | 6/2017 |
| CN | 107180613 A | 9/2017 |
| CN | 108877712 A | 11/2018 |
| CN | 109712551 A | 5/2019 |
| JP | 2006113143 A | 4/2006 |

OTHER PUBLICATIONS

First office action of Chinese application No. 201910100319.4 dated Apr. 2, 2020.

* cited by examiner

GATE DRIVE CIRCUIT AND DRIVE METHOD THEREOF, DISPLAY DEVICE AND CONTROL METHOD THEREOF

CROSS-REFERENCE TO RELATED APPLICATION

The present disclosure is a 371 of PCT Application No. PCT/CN2019/125725, filed on Dec. 16, 2019, which claims priority to Chinese Patent Application No. 201910100319.4, filed on Jan. 31, 2019 and entitled "GATE DRIVING CIRCUIT AND DRIVING METHOD THEREOF, DISPLAY DEVICE AND CONTROL METHOD THEREOF", the entire contents of which are incorporated herein by reference.

TECHNICAL FIELD

The present disclosure relates to the technical field of display, and more particularly, relates to a gate drive circuit and a drive method thereof, and a display device and a control method thereof.

BACKGROUND

The display device generally includes: a display panel and a gate drive circuit for driving pixel units in the display panel to display an image. The display panel includes a plurality of pixel units arranged in an array, wherein each pixel unit is provided with a pixel circuit. The gate drive circuit includes a plurality of cascaded shift register units, wherein the plurality of shift register units are configured to drive different pixel units to emit light. The pixel unit corresponding to a pixel circuit can be controlled to emit light by loading a power signal and a gate drive signal output by the shift register unit on the pixel circuit. A voltage of the power signal loaded on the pixel circuit is configured to acquire the light emitting brightness of the corresponding pixel unit.

SUMMARY

The present disclosure provides a gate drive circuit and a drive method thereof, a display device, and a control method thereof. The technical solutions are as follows.

In a first aspect, a gate drive circuit is provided. The gate drive circuit includes a plurality of cascaded shift register units, wherein each of the shift register units is connected to a pixel circuit in a display panel; and each of the shift register units comprises an output module and is provided with an output terminal, wherein the output module includes: a drive transistor configured to drive the output terminal to output a gate drive signal, and the output terminal is configured to provide the gate drive signal to the pixel circuits connected to the shift register unit provided with the output terminal;

each of the pixel circuits is further connected to a first power supply terminal and is configured to emit light under control of the gate drive signal from the corresponding shift register unit and a first power supply signal from the first power supply terminal; and a width-to-length ratio of a conductive channel of each drive transistor is in negative correlation with a target distance, the target distance being a distance from the corresponding pixel circuit to the first power supply terminal.

Optionally, the target distance is represented by a length of a conductive wire for connecting the corresponding pixel circuit to the first power supply terminal.

Optionally, the first power supply terminal is disposed at a first end of the display panel; in a near-to-far direction from the first end to a second end, the width-to-length ratios of the conductive channels of the drive transistors in the shift register units corresponding to different pixel circuits are gradually reduced; and the first end and the second end are two opposite ends of the display panel.

Optionally, the display panel comprises a plurality of pixel units arranged in an array; wherein each of the pixel units is provided with a pixel circuit, the plurality of pixel units are provided with a plurality of regions, and the width-to-length ratios of the conductive channels of the drive transistors in the shift register units connected to pixel circuits in different regions are different.

Optionally, the pixel circuits in each row of pixel units are connected to the same shift register unit, and each of the regions comprises the pixel circuits in at least one row of pixel units.

Optionally, the shift register unit further includes: an input module, a pull-down control module, and a pull-down module; wherein the input module is connected to an input signal terminal, a clock signal terminal, and a pull-up node respectively, and the input module is configured to provide an input signal from the input signal terminal to the pull-up node under control of a clock signal from the clock signal terminal;

the pull-down control module is connected to the clock signal terminal, the pull-up node, a second power supply terminal, and a pull-down node respectively, and the pull-down control module is configured to provide a second power supply signal from the second power supply terminal to the pull-down node under control of the clock signal, and provide the clock signal to the pull-down node under control of the pull-up node;

the output module is connected to the first power supply terminal, the pull-down node, the pull-up node, a control signal terminal, and the output terminal respectively, and the output module is configured to provide a first power supply signal from the first power supply terminal under control of the pull-down node, and provide a control signal from the control signal terminal to the output terminal under control of the pull-up node; and the pull-down module is connected to the pull-down node, the first power supply terminal, the control signal terminal, and the pull-up node respectively, and the pull-down module is configured to provide the first power supply signal from the first power supply terminal to the pull-up node under control of the pull-down node and the control signal.

Optionally, the input module includes: a first transistor; wherein a gate of the first transistor is connected to the clock signal terminal, a first electrode of the first transistor is connected to the input signal terminal, and a second electrode of the first transistor is connected to the pull-up node;

the pull-down control module includes: a second transistor and a third transistor; wherein a gate of the second transistor is connected to the pull-up node, a first electrode of the second transistor is connected to the clock signal terminal, and a second electrode of the second transistor is connected to the pull-down node; and a gate of the third transistor is connected to the clock signal terminal, a first electrode of the third transistor is connected to the second power supply terminal, and a second electrode of the third transistor is connected to the pull-down node;

the output module includes: a fourth transistor and a drive transistor; wherein a gate of the fourth transistor is connected to the pull-down node, a first electrode of the fourth transistor is connected to the first power supply terminal, and a second electrode of the fourth transistor is connected to the output terminal; and a gate of the drive transistor is connected to the pull-up node, a first electrode of the drive transistor is connected to the control signal terminal, and a second electrode of the drive transistor is connected to the output terminal; and the pull-down module includes: a sixth transistor and a seventh transistor; wherein a gate of the sixth transistor is connected to the pull-down node, a first electrode of the sixth transistor is connected to the first power supply terminal, and a second electrode of the sixth transistor is connected to a first electrode of the seventh transistor; and a gate of the seventh transistor is connected to the control signal terminal, and a second electrode of the seventh transistor is connected to the pull-up node.

In a second aspect, a method for driving a gate drive circuit is provided. The gate drive circuit includes a plurality of cascaded shift register units, and each of the shift register units is correspondingly connected to pixel circuits in a display panel. The method includes:

controlling the plurality of shift register units to output a gate drive signal at an effective potential in a time-sharing fashion, such that the corresponding pixel circuits emit light under control of the gate drive signal.

In a third aspect, a display device is provided. The display device includes a display panel and the gate drive circuit according to any one of the first aspect. The gate drive circuit includes: a plurality of cascaded shift register units; and the display panel comprises pixel circuits connected correspondingly with each of the shift register units; and each of the pixel circuits is further connected to a first power supply terminal and is configured to emit light under control of a gate drive signal from the corresponding shift register unit and a first power supply signal from the first power supply terminal.

In a fourth aspect, a method for controlling a display device is provided. The display device includes: a display panel and the gate drive circuit according to any one of the first aspect; wherein the gate drive circuit includes a plurality of cascaded shift register units, and the display panel includes pixel circuits connected correspondingly with each of the shift register units. The method includes:

controlling the plurality of shift register units to output a gate drive signal at an effective potential in a time-sharing fashion, such that the corresponding pixel circuits emit light under control of the gate drive signal.

In a fifth aspect, a storage medium is provided. A computer program is stored in the storage medium. The method for driving the gate drive circuit in the second aspect, or the method for controlling the display device in the fourth aspect are implemented when the computer program is executed by a processor.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

For clearer descriptions of the objects, technical solutions and advantages of the present disclosure, embodiments of the present disclosure will be described in detail below in combination with the accompanying drawings.

As known by the inventor, a power supply terminal for providing a power signal to the pixel circuit in the display panel is generally arranged at one end (such as the lower end) of the display panel. When the power signal provided by the power supply terminal is loaded on the pixel circuit, a conductive wire for transmitting the power signal passes through a metal layer resistance network in the display region and mutual capacitance is formed between the metal layer resistance network and the conductive wire, which results in that the voltage of the power signal transmitted on the conductive wire is attenuated to a certain degree. The attenuation degree of the voltage is positively correlated with a distance from the corresponding pixel circuit to the power supply terminal, resulting in that voltages of the power signals received by the pixel circuits at different positions are different. Moreover, since the voltage of the power signal is configured to define the light emitting brightness of the corresponding pixel unit, the brightness uniformity of the display panel is poor when the voltages of the power signals received by the pixel circuits at different positions are different.

Figure 1:
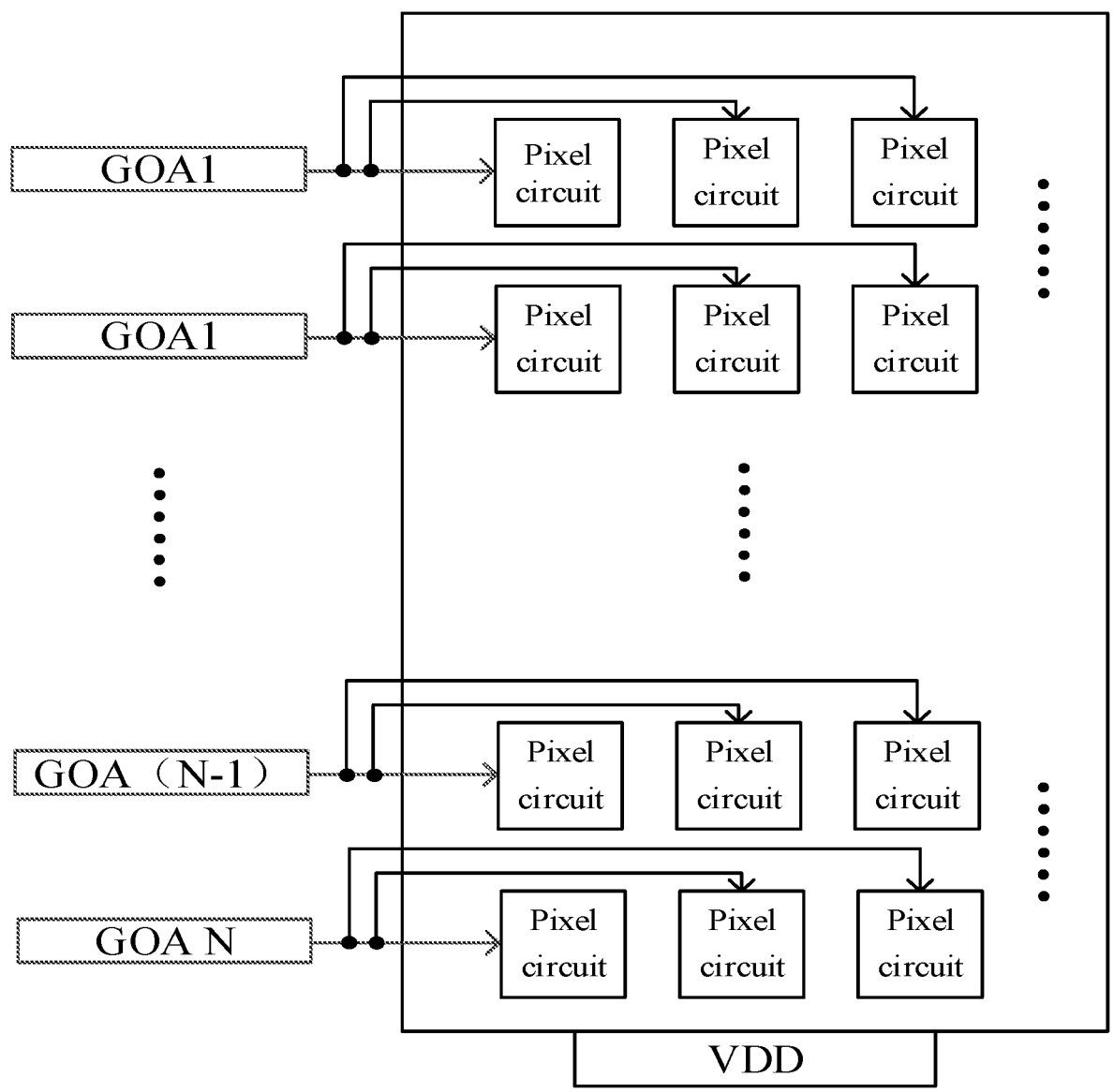
FIG. 1 is a schematic diagram showing shift register units are connected to pixel circuits in a gate drive circuit according to an embodiment of the present disclosure.

For this purpose, the embodiment of the present disclosure provides a gate drive circuit. As shown in FIG. 1, the gate drive circuit includes a plurality of cascaded shift register units, wherein each of the shift register units is connected to pixel circuits in a display panel. FIG. 1 is a schematic structural diagram showing the gate drive circuit includes N shift register units, wherein the N shift register units are: a shift register unit GOA1, a shift register unit GOA2, . . . , a shift register unit GOA (N–1) and a shift register unit GOAN.

Each of the shift register units includes an output module (not shown in FIG. 1). Each of the shift register units is provided with an output terminal. The output module includes a drive transistor for driving the output terminal to output a gate drive signal (not shown in FIG. 1). The output terminal is operable to provide the gate drive signal to the pixel circuit connected to the shift register unit which is provided with the output terminal, so as to charge the pixel circuit.

Each of the pixel circuits is further connected to a first power supply terminal VDD, and is configured to emit light under control of the gate drive signal from the corresponding shift register unit and a power supply signal from the first power supply terminal VDD.

A width-to-length ratio of a conductive channel of each drive transistor is in negative correlation with a target distance. The target distance is a distance from the corresponding pixel circuit to the first power supply terminal VDD.

When the width-to-length ratio of the conductive channel is in negative correlation with the target distance, a pixel circuit more proximal to the first power supply terminal VDD corresponds a conductive channel having a greater width-to-length ratio, and in this case, a greater current is charged to the pixel circuit by the gate drive signal output by the shift register unit, and accordingly the charging voltage after the pixel circuit is charged is greater. That is, the charging voltage is in negative correlation with the target distance. When the attenuation degree of the first power supply signal is in positive correlation with the distance from the corresponding pixel circuit to the power supply terminal, the voltage input to the first power supply signal of the pixel circuit more proximal to the first power supply terminal VDD is greater. That is, the voltage of the first power supply signal input to the pixel circuit is in negative correlation with the target distance. Therefore, the increase of the charging voltage of any one of pixel circuits relative to the charging voltage of other pixel circuits may offset the attenuation of the voltage of the first power supply signal.

Furthermore, the light emitting brightness of the pixel circuit is defined by the current during light emission of the pixel circuit. The current is defined by a difference value between the charging voltage of the pixel circuit and the voltage of the first power supply signal. When the increase degree of the charging voltage relative to the charging voltage of other pixel circuits can offset the attenuation degree of the voltage of the first power supply signal, the difference values between the charging voltages of a plurality of pixel circuits on the display panel and the voltage of the first power supply signal are approximately equal, and the light emitting brightness of the plurality of pixel circuits is approximately the same, thereby improving the brightness uniformity of the display panel.

In conclusion, according to the gate drive circuit provided by the embodiment of the present disclosure, the width-to-length ratio of the conductive channel of each drive transistor is in negative correlation with the target distance, such that the charging voltage is in negative correlation with the target distance. The attenuation degree of the voltage of the first power supply signal is in positive correlation with the target distance, such that the increase of the charging voltage relative to the charging voltage of other pixel circuits may offset the attenuation of the first power supply signal. Compared with the related art, the difference values between the charging voltages of the plurality of pixel circuits on the display panel and the voltage of the first power supply signal are approximately equal, such that the light emitting brightness of the plurality of pixel circuits is approximately the same, thereby improving the brightness uniformity of the display panel effectively.

The attenuation of the first power supply signal is caused by mutual capacitance formed between the conductive wire for transmitting the first power supply signal and the metal layer resistance network in the display region, and the longer the conductive wire is, the greater the value of the mutual capacitance is. Accordingly, it may be identified that the attenuation degree of the first power supply signal is in positive correlation with the length of the conductive wire. Therefore, the target distance may be represented by the length of the conductive wire for connecting the corresponding pixel circuit to the first power supply terminal. That is, the longer the conductive wire for connecting the corresponding pixel circuit to the first power supply terminal is, the smaller the width-to-length ratio of the conductive channel of the drive transistor in the shift register unit connected to the pixel circuit is. Accordingly, during the process of designing the gate drive circuit, the length of the conductive wire for connecting the corresponding pixel circuit to the first power supply terminal is calculated firstly, then the width-to-length ratio of the conductive channel of the drive transistor in the shift register unit connected to the pixel circuit is calculated, and other parameters of the drive transistor and parameters of other devices in shift register unit are calculated according to other requirements, so as to practice the design of the gate drive circuit.

Figure 2:
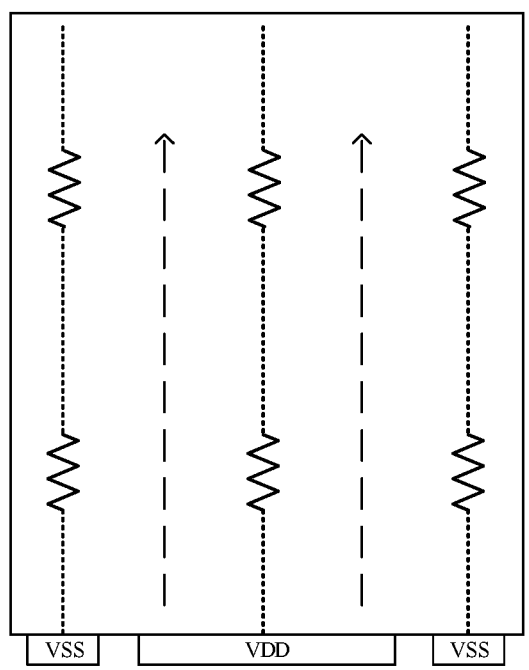
FIG. 2 is a schematic structural diagram showing a first power supply terminal is arranged at one end of a display panel according to an embodiment of the present disclosure.

In some embodiments, when the first power supply terminal is disposed at a first end of the display panel, in a near-to-far direction from the first end to a second end of the display panel, the distance from different pixel circuits to the first power supply terminal is gradually increased. Accordingly, the width-to-length ratios of the conductive channels of the drive transistors in the shift register units corresponding to different pixel circuits are gradually reduced. The second end and the first end are two opposite ends of the display panel. The position of the pixel circuits on the display panel may be represented by a position of a geometric center of the pixel unit provided with the pixel circuit. Exemplarily, as shown in FIG. 2, when a first power supply terminal VDD and a second power supply terminal VSS for supplying power to the pixel circuits are disposed in the middle of the lower end of the display panel, the first end of the display panel is the bottom end of the display panel and the second end of the display panel is the top end of the display panel. At this time, in the near-to-far direction from the first end to the second end of the display panel (i.e. in the direction of the arrows shown in FIG. 2), the distances from different pixel circuits to the first power supply terminal VDD are gradually increased. Accordingly, the width-to-length ratios of the conductive channels of the drive transistors in the shift register units corresponding to the pixel circuits at different positions are gradually reduced.

Further, the display panel may include a plurality of pixel units arranged in an array. Each of the pixel units is provided with a pixel circuit, and a plurality of pixel units have a plurality of regions. At this time, the width-to-length ratios of the conductive channels of the drive transistors of the shift register units connected to the pixel circuits in different regions are different. The different regions may be divided according to the influence degree on the light emitting brightness of the pixel unit by the target distance.

In some embodiments, when the pixel circuits of each row of pixel units are connected to the same shift register unit, each region may include the pixel circuits in at least one row of pixel units. Optionally, the number of rows of pixel units included in different regions may be equal or unequal. For example, according to an order, from near to far, of the distance from the pixel unit to the first power supply terminal VDD, the number of rows of pixel units included in different regions may be sequentially increased. Alternatively, according to an order, from near to far, of the distance from the pixel unit to the first power supply terminal VDD, the number of rows of pixel units included in different regions may stepwise increase. That is, the number of rows of pixel units included in a plurality of regions belonging to the same step is equal, and the number of rows of pixel units included in regions belonging to different steps is unequal.

Figure 3:
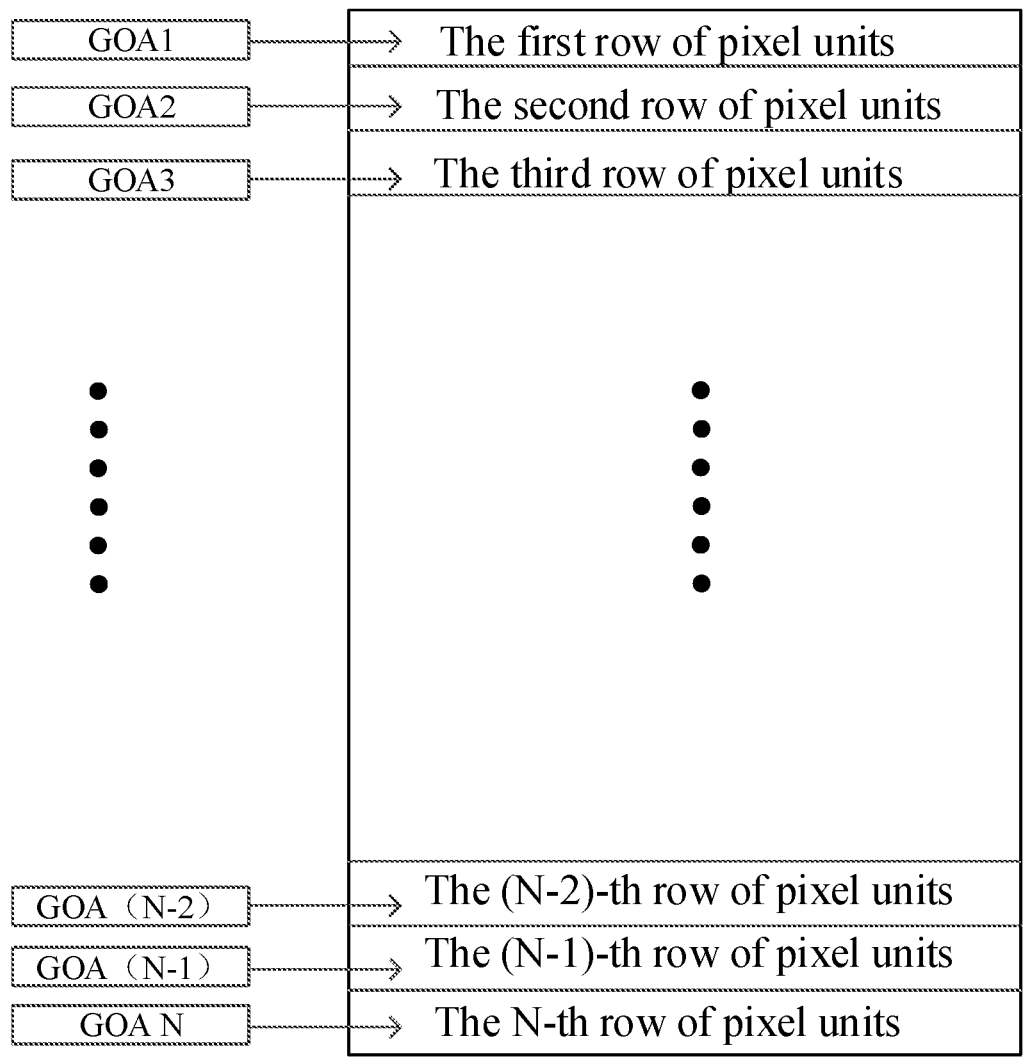
FIG. 3 is a schematic diagram showing pixel circuits are connected to shift register units according to an embodiment of the present disclosure.

Exemplarily, as shown in FIG. 3, pixel circuits in each row of pixel units are connected to the same shift register unit. According to the influence degree on the light emitting brightness of the pixel units by the target distance, a plurality of pixel units in each row of pixel units on the display panel may be divided into one region to obtain N regions, that is, each region includes the pixel circuits in one row of pixel units.

In order to facilitate the description of the relationship between the charging voltage of the pixel circuit and the width-to-length ratio of the conductive channel of the drive transistor, the circuit structures of the gate drive circuit and the shift register unit according to the embodiment of the present disclosure will be described below.

Figure 4:
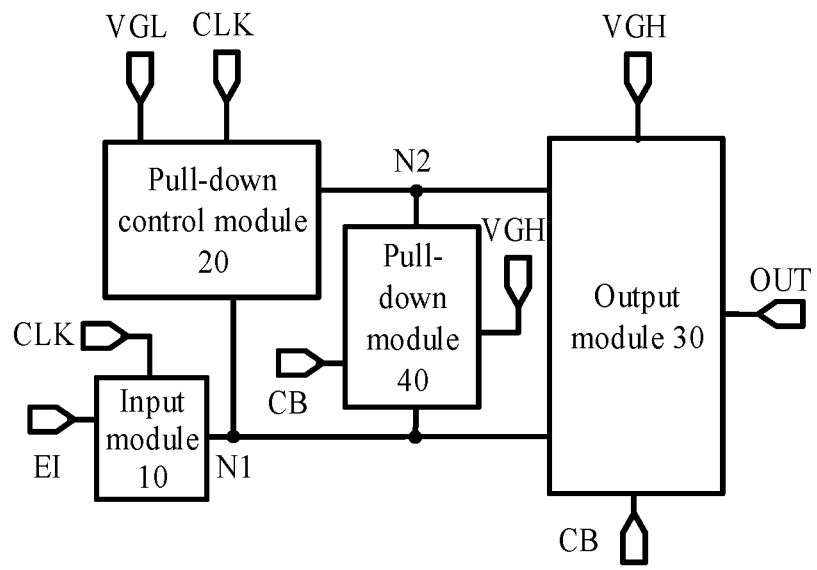
FIG. 4 is a schematic structural diagram of a shift register unit according to an embodiment of the present disclosure.

As shown in FIG. 4, the shift register unit may include: an input module 10, a pull-down control module 20, an output module 30 and a pull-down module 40.

The input module 10 is connected to an input signal terminal EI, a clock signal terminal CLK and a pull-up node N1 respectively. The input module 10 is configured to provide an input signal from the input signal terminal EI to the pull-up node N1 under control of a clock signal from the clock signal terminal CLK. For example, the input module 10 may provide the input signal to the pull-up node N1 when the clock signal is at an active level.

The pull-down control module 20 is connected to the clock signal terminal CLK, the pull-up node N1, a second power supply terminal VGL and a pull-down node N2 respectively. The pull-down control module 20 is configured to provide a second power signal from the second power supply terminal VGL under control of the clock signal and provide a clock signal to the pull-down node N2 under control of the pull-up node N1. For example, the pull-down control module 20 may provide a second power signal to the pull-down node N2 when the clock signal is at an active level, and provide a clock signal to the pull-down node N2 when the pull-up node N1 is at an active level.

The output module 30 is connected to a first power supply terminal VGH, the pull-down node N2, the pull-up node N1, a control signal terminal CB and an output terminal OUT respectively. The output module 30 is configured to provide a first power signal from the first power supply terminal VGH to the output terminal OUT under control of the pull-down node N2 and provide a control signal from the control signal terminal CB to the output terminal OUT under control of the pull-up node N1. For example, the output module 30 may provide the first power signal to the output terminal OUT when the pull-down node N2 is at an active level, and provide the control signal to the output terminal OUT when the pull-up node N1 is at an active level.

The pull-down module 40 is connected to the pull-down node N2, the first power supply terminal VGH, the control signal terminal CB and the pull-up node N1 respectively. The pull-down module 40 is configured to provide the first power supply signal from the first power supply terminal VGH to the pull-up node N1 under control of the pull-down node N2 and the control signal. For example, the pull-down module 40 may provide the first power signal to the pull-up node N1 when the pull-down node N2 and the control signal are at the active level.

Figure 5:
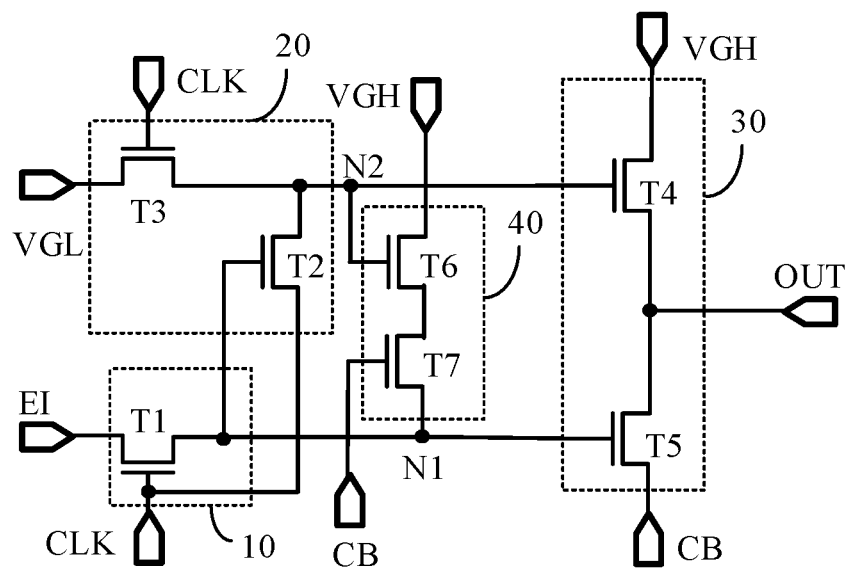
FIG. 5 is a schematic structural diagram of another shift register unit according to an embodiment of the present disclosure.

In some embodiments, as shown in FIG. 5, the input module 10 may include: a first transistor T1.

A gate of the first transistor T1 is connected to the clock signal terminal CLK, a first electrode of the first transistor T1 is connected to the input signal terminal EI, and a second electrode of the first transistor T1 is connected to the pull-up node N1.

As shown in FIG. 5, the pull-down control module 20 may include: a second transistor T2 and a third transistor T3.

A gate of the second transistor T2 is connected to the pull-up node N1, a first electrode of the second transistor T2 is connected to the clock signal terminal CLK, and a second electrode of the second transistor T2 is connected to the pull-down node N2.

A gate of the third transistor T3 is connected to the clock signal terminal CLK, a first electrode of the third transistor T3 is connected to the second power supply terminal VGL, and a second electrode of the third transistor T3 is connected to the pull-down node N2.

As shown in FIG. 5, the output module 30 may include: a fourth transistor T4 and a drive transistor T5.

A gate of the fourth transistor T4 is connected to the pull-down node N2, a first electrode of the fourth transistor T4 is connected to the first power supply terminal VGH, and a second electrode of the fourth transistor T4 is connected to the output terminal OUT.

A gate of the drive transistor T5 is connected to the pull-up node N1, a first electrode of the drive transistor T5 is connected to the control signal terminal CB, and a second electrode of the drive transistor T5 is connected to the output terminal OUT.

As shown in FIG. 5, the pull-down module 40 may include: a sixth transistor T6 and a seventh transistor T7.

A gate of the sixth transistor T6 is connected to the pull-down node N2, a first electrode of the sixth transistor T6 is connected to the first power supply terminal VGH, and a second electrode of the sixth transistor T6 is connected to a first electrode of the seventh transistor T7.

A gate of the seventh transistor T7 is connected to the control signal terminal CB, and a second electrode of the seventh transistor T7 is connected to the pull-up node N1.

Figure 6:
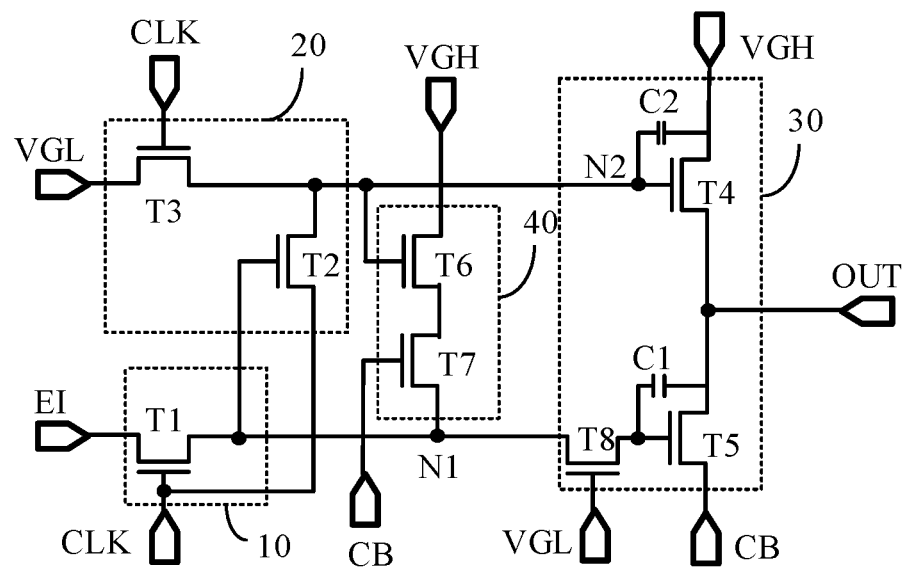
FIG. 6 is a schematic structural diagram of yet another shift register according to an embodiment of the present disclosure.

Further, as shown in FIG. 6, the output module may further include: an eighth transistor T8, and at least one of a first capacitor C1 and a second capacitor C2.

A gate of the eighth transistor T8 is connected to the second power supply terminal VGL, a first electrode of the eighth transistor T8 is connected to the pull-up node N1, and a second electrode of the eighth transistor T8 is connected to a gate of the drive transistor T5. By connecting the eighth transistor T8 between the pull-up node N1 and the gate of the drive transistor T5, it is possible to isolate the drive transistor T5 and the first transistor T1 as well as the drive transistor T5 and the second transistor T2 when the drive transistor T5 is in a conducting state, so as to avoid damage to the first transistor T1 and the second transistor T2 caused by large voltage difference between the drive transistor T5 and the first transistor T1 as well as the drive transistor T5 and the second transistor T2.

One end of the first capacitor C1 is connected to the gate of the drive transistor T5, and the other end of the first capacitor C1 is connected to the second electrode of the drive transistor T5. The first capacitor C1 is configured to stabilize the voltage of the pull-up node N1.

One end of the second capacitor C2 is connected to the gate of the fourth transistor T4, and the other end of the second capacitor C2 is connected to the first electrode of the fourth transistor T4. The second capacitor C2 is configured to stabilize the voltage of the pull-down node N2.

Figure 7:
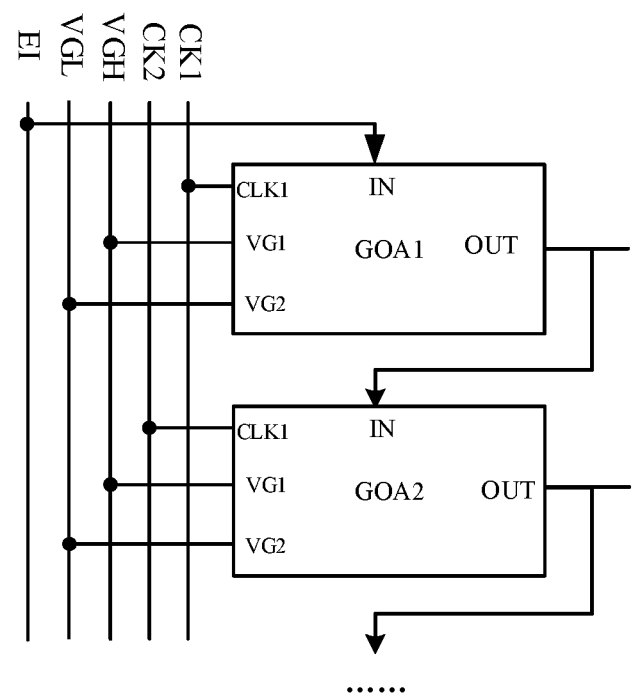
FIG. 7 is a schematic structural diagram of a gate drive circuit according to an embodiment of the present disclosure.

Accordingly, in the gate drive circuit according to the embodiment of the present disclosure, the output terminal OUT of the j-th shift register unit may be connected to the input signal terminal EI of the (j+1)-th shift register unit, wherein j is a positive integer. Exemplarily, FIG. 7 is a schematic diagram of a partial structure of a gate drive circuit according to an embodiment of the present disclosure. The structure as shown in FIG. 7 includes two cascaded shift register units. Each shift register unit, in the two cascaded shift register units, may be a shift register unit according to the embodiment of the present disclosure. As shown in FIG. 7, the display device may be provided with an input signal terminal EI, two clock signal terminals CK1 and CK2, a first power signal terminal VGH and a second power signal terminal VGL. The first power signal terminal VG1 of each shift register unit is connected to the first power signal terminal VGH, and the second power signal terminal VG2 of each shift register unit is connected to the second power signal terminal VGL. The input signal terminal EI outputs an input signal, and the two clock signal terminals CK1 and CK2 output a first clock signal and a second clock signal respectively. A duty cycle of the first clock signal is equal to a duty cycle of the second clock signal, and the two clock signal terminals CK1 and CK1 output the clock signals at the active level sequentially. In the two cascaded shift register units, an signal input by an input signal terminal IN of the first-stage shift register unit GOA1 is an input signal, and a clock signal input by the clock signal terminal CLK1 of the first-stage shift register unit GOA1 is a first clock signal output by the clock signal terminal CK1. An input signal input by an input signal terminal IN of the second-stage shift register unit GOA2 is an output signal of the first-stage shift register unit GOA1, and a clock signal input by the clock signal terminal CLK1 of the second-stage shift register unit GOA2 is a second clock signal output by the clock signal terminal CK2. The gate drive circuit according to the embodiment of the present disclosure may repeat the above connection by taking the two shift register units as a unit.

Optionally, a method for driving the gate drive circuit may include: controlling the plurality of shift register units to output gate drive signals at an effective potential in a time-sharing fashion, such that the corresponding pixel circuits emit light under control of the gate drive signal, wherein the time-sharing refers to that durations of outputting the gate drive signal at the effective potential by the plurality of shift register units do not overlap.

Accordingly, a method for driving each shift register may include: controlling the input signal terminal to provide an input signal at an active level to the input module of the shift register unit when the clock signal is at the active level and the control signal is at an invalid level in a charging stage. Moreover, for convenient control of the plurality of shift register units in the gate drive circuit, duration for outputting the gate drive signals at the effective potential by the plurality of shift register units may be equal.

Figure 8:
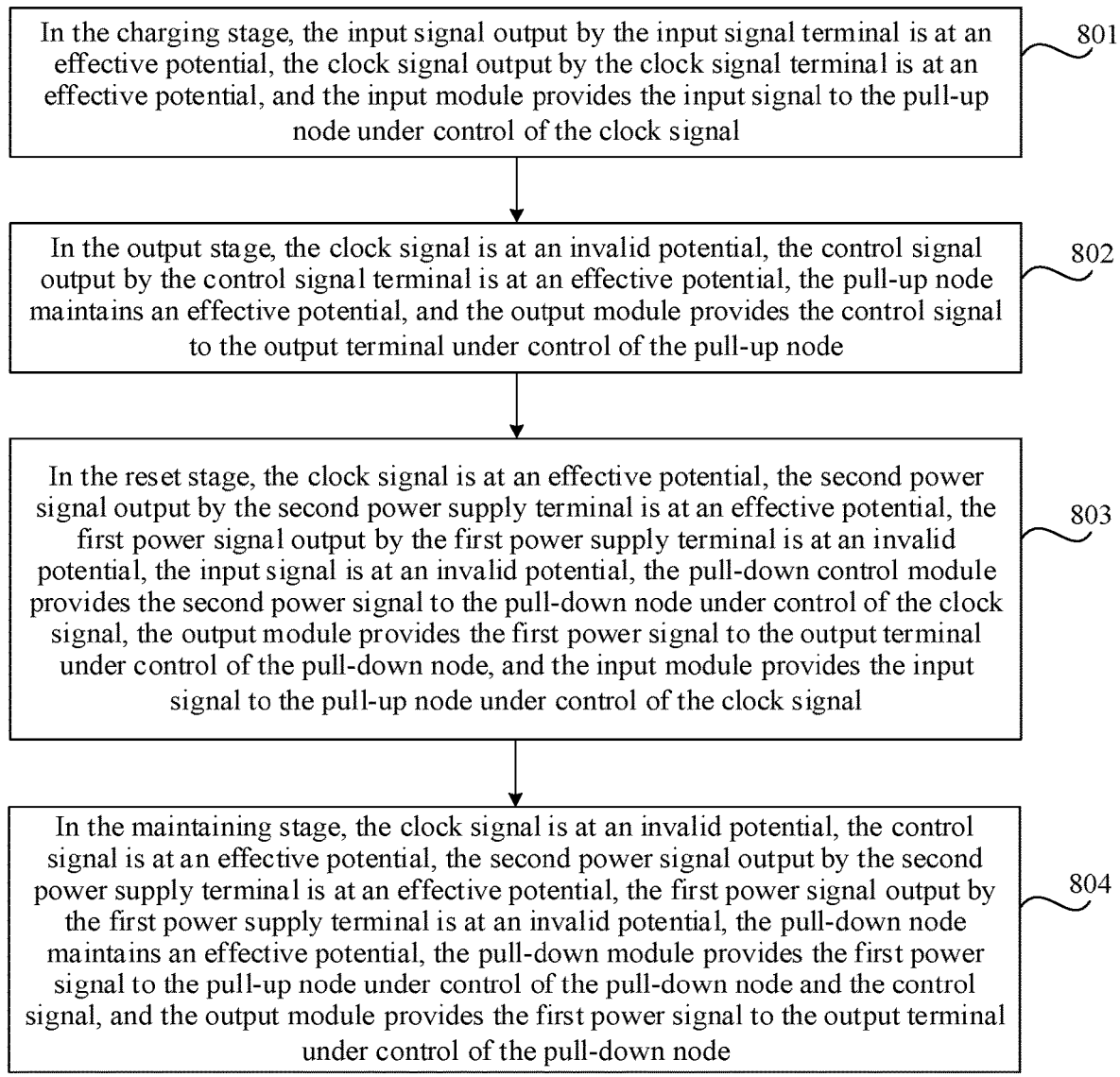
FIG. 8 is a flowchart of a method for driving a shift register unit according to an embodiment of the present disclosure.

Exemplarily, FIG. 8 is a flowchart of a method for driving a shift register unit according to an embodiment of the present disclosure. As shown in FIG. 8, the method may include: a charging state, an output stage and a reset stage. The working process of each stage will be described as follows.

In step 801, in the charging stage, the input signal output by the input signal terminal is at an effective potential, the clock signal output by the clock signal terminal is at an effective potential, and the input module provides the input signal to the pull-up node under control of the clock signal.

In step 802, in the output stage, the clock signal is at an invalid potential, the control signal output by the control signal terminal is at an effective potential, the pull-up node maintains an effective potential, and the output module provides the control signal to the output terminal under control of the pull-up node.

In step 803, in the reset stage, the clock signal is at an effective potential, the second power signal output by the second power supply terminal is at an effective potential, the first power signal output by the first power supply terminal is at an invalid potential, the input signal is at an invalid potential, the pull-down control module provides the second power signal to the pull-down node under control of the clock signal, the output module provides the first power signal to the output terminal under control of the pull-down node, and the input module provides the input signal to the pull-up node under control of the clock signal.

Optionally, still referring to FIG. 8, the method may further include: a maintaining stage. The working process of the maintaining stage will be described as follows.

In step 804, in the maintaining stage, the clock signal is at an invalid potential, the control signal is at an effective potential, the second power signal output by the second power supply terminal is at an effective potential, the first power signal output by the first power supply terminal is at an invalid potential, the pull-down node maintains an effective potential, the pull-down module provides the first power signal to the pull-up node under control of the pull-down node and the control signal, and the output module provides the first power signal to the output terminal under control of the pull-down node.

Figure 9:
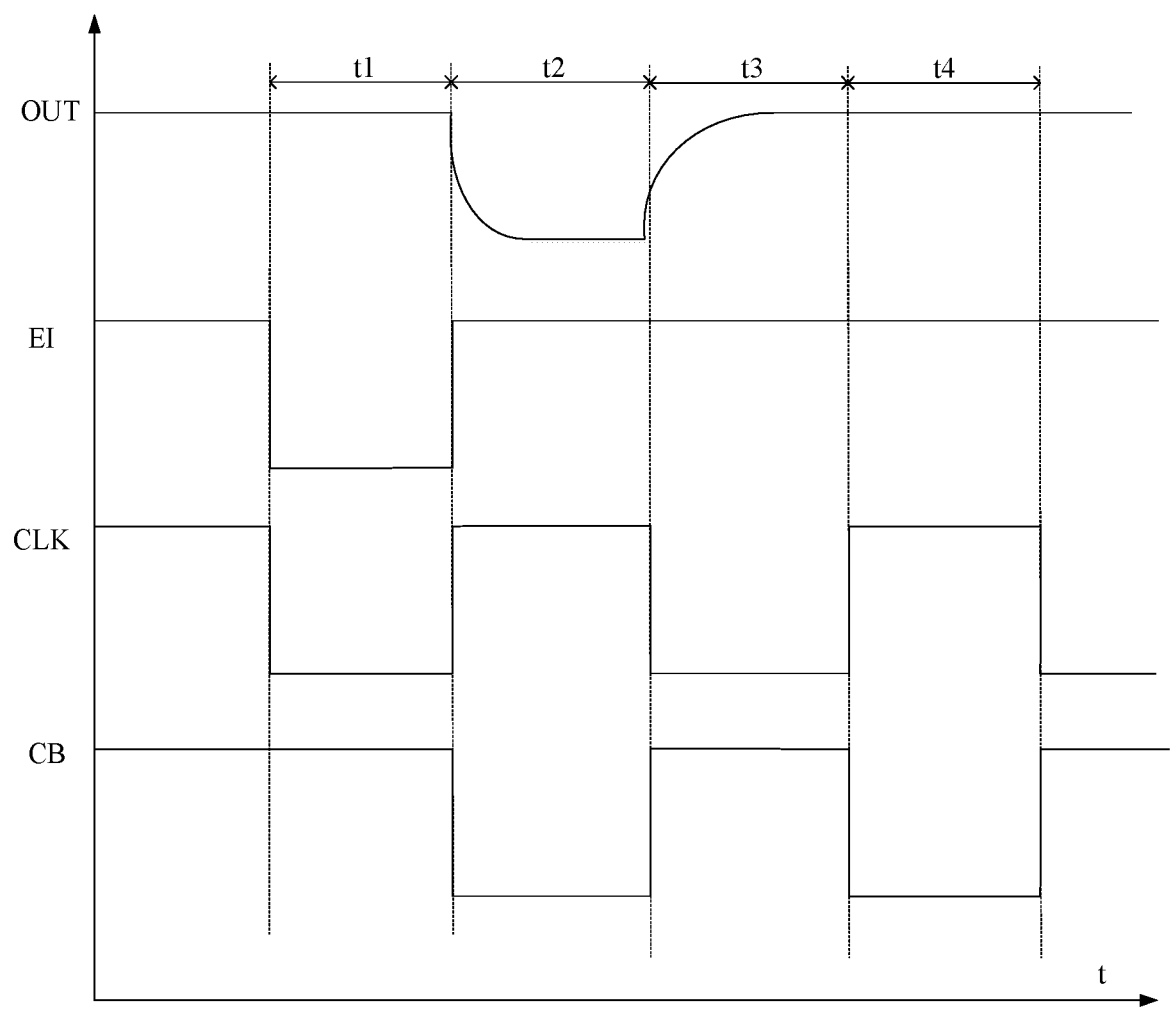
FIG. 9 is a sequence chart of a process for driving a shift register unit according to an embodiment of the present disclosure.

FIG. 9 is a sequence chart of a process for driving a shift register unit according to an embodiment of the present disclosure. Taking the fact that a shift register unit is as shown in FIG. 6, each transistor in the shift register unit is a P-type transistor and the effective potential is a low potential relative to an invalid potential as an example, a driving principle of the shift register unit provided by the embodiment of the present disclosure will be described in details.

Please refer to FIG. 9, in the charging stage t1, the potential of the clock signal output by the clock signal terminal CLK is low, the potential of the input signal output by the input signal terminal EI is low, the potential of the control signal output by the control signal terminal CB is high, the potential of the first power signal output by the first power supply terminal VGH is high, and the potential of the second power signal output by the second power supply terminal VGL is low. The first transistor T1 is turned on under control of the clock signal, and the input signal terminal EI provides the input signal at the low potential to the pull-up node N1 through the first transistor T1 to charge the pull-up node N1, so that the potential of the pull-up node N1 maintains low. Accordingly, the second transistor T2 is turned on under control of the pull-up node N1 at the low potential, and the clock signal terminal CLK provides the clock signal at the low potential to the pull-down node N2 through the second transistor T2. Moreover, the third transistor T3 is turned on under control of the clock signal at the low potential, and the second power supply terminal VGL provides the second power signal at the low potential to the pull-down node N2 through the third transistor T3. Under the combined action of the second power signal and the clock signal, the potential of the pull-down node N2 maintains low. The fourth transistor T4 is turned on under control of the pull-down node N2, and the first power supply terminal VGH provides the first power signal at the high potential to the output terminal OUT through the fourth transistor T4.

Meanwhile, under the action of the second power signal, the eighth transistor T8 is turned on, the pull-up node N1 controls the drive transistor T5 to be turned on through the eighth transistor T8, and the control signal terminal CB provides a power signal at the high potential to the output terminal OUT through the drive transistor T5. As the output terminal OUT can simultaneously output the control signal and the first power signal at the high potential, the voltage stability of the output terminal OUT can be guaranteed.

In the output stage t2, the potential of the clock signal output by the clock signal terminal CLK is high, the potential of the input signal output by the input signal terminal EI is high, the potential of the control signal output by the control signal terminal CB is low, the potential of the first power signal output by the first power supply terminal VGH is high, the potential of the second power signal output by the second power supply terminal VGL is low, and the potential of the pull-up node N1 maintains low. Under the action of the second power signal, the eighth transistor T8 is turned on, the pull-up node N1 controls the drive transistor T5 to be turned on through the eighth transistor T8, and the control signal terminal CB provides the control signal at the low potential to the output terminal OUT through the drive transistor T5, so as to drive the pixel unit in the display panel.

Furthermore, as the potential of the clock signal is high, both the first transistor T1 and the third transistor T3 are turned off. Under the action of the pull-up node N1 of which the potential maintains low, the second transistor T2 is turned on, and the clock signal terminal CLK inputs the clock signal at the high potential to the pull-down node N2 through the second transistor T2, so that the potential of the pull-down node is changed into high potential. Under control of the pull-down node N2, both the sixth transistor T6 and the fourth transistor T4 are turned off. As the fourth transistor T4 is turned off, the first power signal can be prevented from interfering with the output of the output terminal OUT, and the stability of the output of the output terminal OUT can be guaranteed. As the sixth transistor T6 is turned off, the first power signal can be prevented from interfering with the potential of the pull-up node N1, and the stability of the potential of the pull-up node N1 can be guaranteed.

In the reset stage t3, the potential of the clock signal output by the clock signal terminal CLK is low, the potential of the input signal output by the input signal terminal EI is high, the potential of the control signal output by the control signal terminal CP is high, the potential of the first power signal output by the first power supply terminal VGH is high, and the potential of the second power signal output by the second power supply terminal VGL is low. The third transistor T3 is turned on under control of the clock signal at the low potential, and the second power supply terminal VGL provides the second power signal at the low potential to the pull-down node N2 through the third transistor T3, so that the potential of the pull-down node N2 is changed into low potential. The fourth transistor T4 is turned on under control of the pull-down node N2, and the first power supply terminal VGH provides the first power signal at the high potential to the output terminal OUT through the fourth transistor T4 to reset the output terminal OUT, so that thin film transistors (TFT) in the pixel circuit connected to the shift register unit maintain an off state.

Moreover, the first transistor T1 is turned on under control of the clock signal, and the input signal terminal EI provides the input signal at the high potential to the pull-up node N1 through the first transistor T1 to reset the pull-up node N1. Meanwhile, as the sixth transistor T6 is turned on under control of the pull-down node N2 at the high potential, and the seventh transistor T7 is turned off under control of the control signal at the high potential, the stability of the voltage of the pull-up node N2 can be guaranteed.

Further, as the eighth transistor T8 is turned on under the action of the second power signal, and the pull-up node N1 at the high potential controls the drive transistor T5 to be turned off through the eighth transistor T8, the stability of the potential of the output terminal OUT can be guaranteed.

In the maintaining stage t4, the potential of the clock signal output by the clock signal terminal CLK is high, the potential of the input signal output by the input signal terminal EI is high, the potential of the control signal output by the control signal terminal CB is low, the potential of the first power signal output by the first power terminal VGH is high, the potential of the second power signal output by the second power supply terminal VGL is low, and the potential of the pull-down node N2 maintains low. The fourth transistor T4 is turned on under control of the pull-down node N2, and the first power supply terminal VGH can output the first power signal to the output terminal OUT through the fourth transistor T4, that is, continuous reset of the output terminal OUT can be realized.

Furthermore, as both the first transistor T1 and the third transistor T3 are turned off under control of the clock signal, and the second transistor T2 is turned off under control of the pull-up node N1 at the high potential, it can be ensured that the potential of the pull-down node N2 stably maintains low.

Meanwhile, as the sixth transistor T6 is turned on under control of the pull-down node N2, the seventh transistor T7 is turned on under control of the control signal, and the first power supply terminal VGH may provide the first power signal to the pull-up node N1 through the sixth transistor T6 and the seventh transistor T7, the potential of the pull-up node N1 maintains high. Accordingly, as the eighth transistor T8 is turned on under the action of the second power signal, and the pull-up node N1 at the high potential controls the drive transistor T5 to be turned off through the eighth transistor T8, the stability of the potential of the output terminal OUT can be guaranteed.

As can be seen from the circuit structure of the shift register unit, the charging voltage of the pixel circuit is defined by the output current of the drive transistor T5 and the duration of outputting the gate drive signal at the effective potential. In order to conveniently control the plurality of shift register units, durations of outputting the gate drive signals at the effective potential by the plurality of shift register units are generally equal. Therefore, it can be identified that the charging voltage is defined by the output current of the drive transistor T5. A current formula of the drive transistor T5 is: $I=1/2 \times u \times Cox \times W/L \times (Vgs-Vth)^2$, wherein u is an electron mobility of the drive transistor T5, Cox is an equivalent capacitance per unit width-to-length ratio, W/L is a width-to-length ratio of the conductive channel of the drive transistor T5, Vgs is a voltage between the gate and the source of the drive transistor T5, and Vth is a threshold voltage of the drive transistor T5. As can be seen from the current formula, the output current is mainly defined by the width-to-length ratio of the conductive channel of the drive transistor T5. Therefore, by adjusting the width-to-length ratio of the conductive channel of the drive transistor T5 the output current of the drive transistor T5 can be adjusted, and thus the charging voltage of the pixel circuit can be adjusted.

Figure 10:
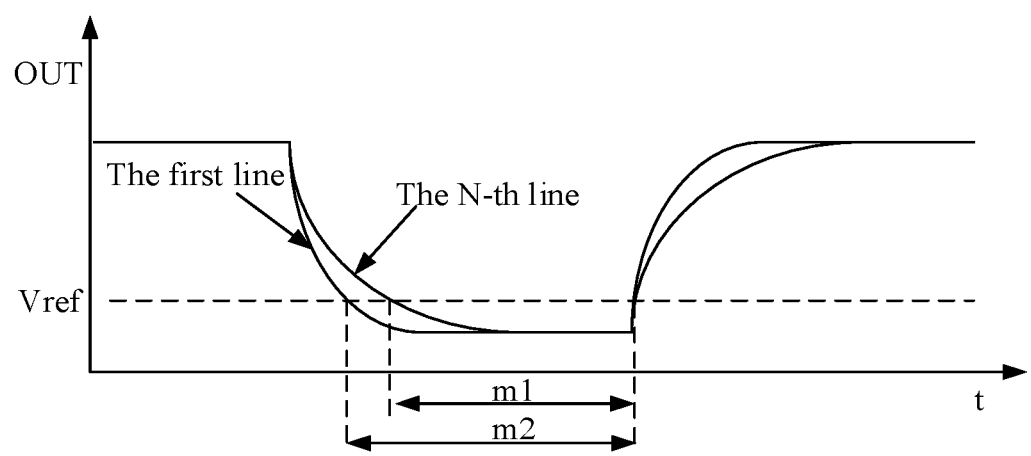
FIG. 10 is a schematic diagram of waveforms of charging pixel circuits in the first line and the N-th line of pixel units according to an embodiment of the present disclosure.

Furthermore, as can be seen from the sequence chart as shown in FIG. 9, when the potentials of the gate drive signals at the effective potential output by the shift register units are equal, the influence on the charging voltage of the corresponding pixel circuit by the output current of the drive transistor T5 mainly embodies the influence on charging time of the pixel circuit, and the charging time is in positive correlation with the charging voltage. The charging time may be a duration of charging an absolute value of the voltage of the pixel circuit to a specified voltage amplitude and maintaining the value not smaller than the specified voltage amplitude. For example, please refer to FIG. 10, for the pixel circuits in the first row and the N-th row of pixel units, the charging time may be the duration of charging an absolute value of the voltage of the pixel circuit to a specified voltage amplitude Vref and maintaining the value not smaller than the specified voltage amplitude Vref, that is, the charging time of the pixel circuits in the first line of pixel units is m1, and the charging time of the pixel circuits in the N-th row of pixel units is m2. Furthermore, as can be seen from FIG. 10, when the pixel circuit is charged, the charging time is mainly affected by the rise time and the fall time of the waveform of the gate drive signal, and the charging time is shorter when at least one of the rise time and the fall time is longer. Therefore, by adjusting the width-to-length ratio of the conductive channel of the drive transistor T5 in the shift register unit, the charging time of the pixel circuit can be adjusted, and further the charging voltage of the pixel circuit can be adjusted.

In order to facilitate description of the principle that the increase degree of the charging voltage offsets the attenuation degree of the voltage of the first power supply signal, the circuit structure of the pixel circuit provided by the embodiment of the present disclosure will be described below.

Figure 11:
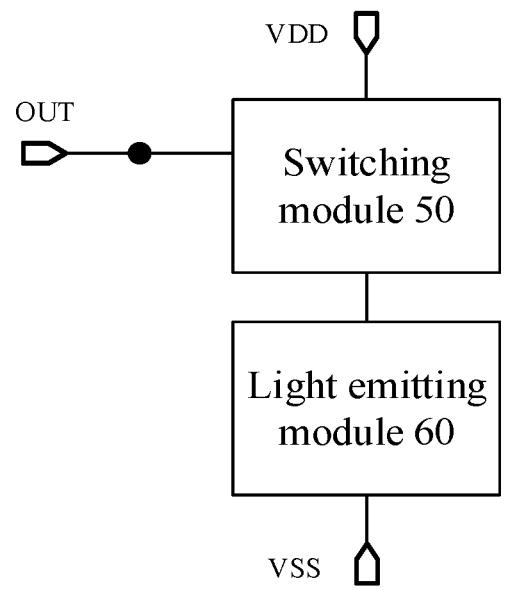
FIG. 11 is a schematic structural diagram of a pixel circuit according to an embodiment of the present disclosure.

For each pixel circuit in the display panel, as shown in FIG. 11, the pixel circuit may include: a switching module 50 and a light emitting module 60.

The switching module 50 is connected to the output terminal OUT of the corresponding shift register unit, the first power supply terminal VDD and the light emitting module 60 respectively. The switching module 50 is configured to provide the first power supply signal to the light emitting module 60 under control of the gate drive signal from the corresponding shift register unit.

Furthermore, the light emitting module 60 is connected to the second power supply terminal VSS. The light module 60 is configured to emit light under control of the first power supply signal and the second power signal from the second power supply terminal VSS.

Figure 12:
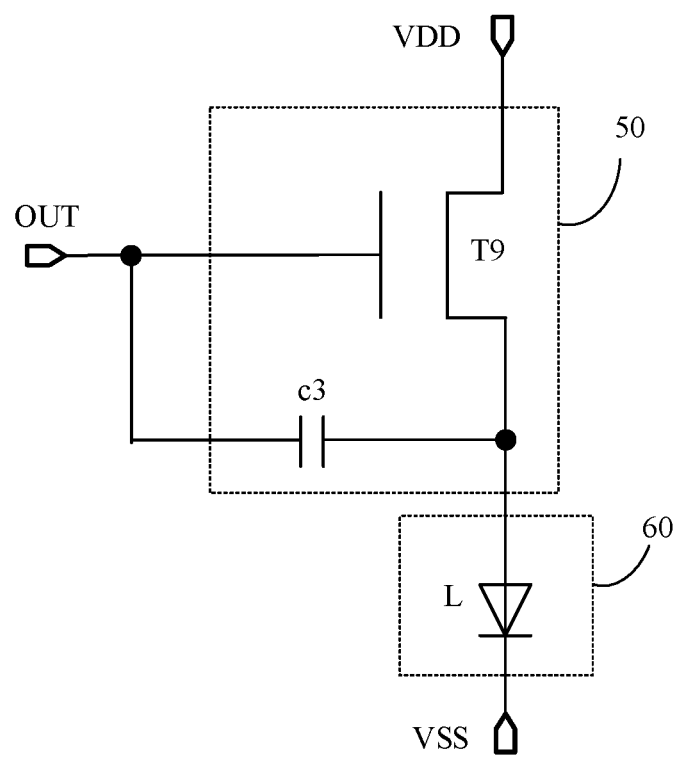
FIG. 12 is a schematic structural diagram of another pixel circuit according to an embodiment of the present disclosure.

In some embodiments, referring to FIG. 12, the switching module 50 may include a ninth transistor T9. The light emitting module 60 may include a light emitting device L, wherein the light emitting device L may be a light emitting diode, etc.

A gate of the ninth transistor T9 is connected to the output terminal OUT of the corresponding shift register unit, a first electrode of the ninth transistor T9 is connected to the first power supply terminal VDD, and a second electrode of the ninth transistor T9 is connected to one end of the light emitting device L. The other end of the light emitting device L is connected to the second power supply terminal VSS.

Optionally, the switching module 50 may further include a third capacitor C3. One end of the third capacitor C3 is connected to the gate of the ninth transistor T9 and the other end of the third capacitor C3 is connected to the second electrode of the ninth transistor T9. The third capacitor C3 is configured to maintain the stability of the voltage of the ninth transistor T9.

A method for driving the pixel circuit may include followings. After the shift register unit connected to the pixel circuit outputs the gate drive signal at the effective potential, the ninth transistor T9 is turned on under control of the gate drive signal, the first power supply terminal VDD provides the first power supply signal to one end of the light emitting device L through the ninth transistor T9. At this time, the light emitting device L may emit light under control of the first power supply signal and the second power supply signal.

A saturation current formula of the light emitting device L is: $I=1/2 \times u \times Cox \times W/L \times (Vgs-Vth)^2$, wherein u is an electron mobility of the drive transistor in the shift register unit connected to the pixel circuit; Cox is an equivalent capacitance per width-to-length ratio; W/L is a width-to-length ratio of the conductive channel of the drive transistor; Vth is a threshold voltage of the drive transistor; Vgs is a voltage between the gate and the first electrode of the ninth threshold voltage T9. That is, Vgs=V(N)−VGH, V(N) is the voltage of the gate of the ninth transistor T9, may also be called the charging voltage of the pixel circuit, and VGH is the voltage of the first electrode of the ninth threshold voltage T9, namely the voltage of the first power supply signal received by the pixel circuit. Therefore, when the pixel circuit is closer to the first power supply terminal, the width-to-length ratio of the conductive channel of the drive transistor is greater, the duration of charging the pixel circuit connected to the drive transistor is longer, and the charging voltage V(N) is higher. And when the pixel circuit is closer to the first power supply, the attenuation degree of the voltage of the first power supply signal is smaller and the voltage VGH of the first power supply signal received by the pixel circuit is higher. Accordingly, when the charging voltage V(N) differs from the voltage VGH, the increase degree of the charging voltage relative to the charging voltages of other pixel circuits can offset the attenuation degree of the voltage of the first power supply signal, so that the difference values of the charging voltages of the plurality of circuits and the voltage of the first power supply signal are approximately equal and the light emitting brightness of the plurality of pixel circuits is approximately equal.

It should be noted that, transistors adopted in the embodiment of the present disclosure may be thin film transistors or field effect transistors or other devices with the same characteristics, and mainly be switching transistors according to its role in the circuit. Sources and drains of the switching transistors adopted herein are symmetrical, so the sources and the drains may be interchanged. In the embodiment of the present disclosure, the source is called a first electrode and the drain is called a second electrode. According to the forms in the accompanying drawings, the intermediate end of the transistor is a gate, the signal input terminal is a source, and the signal output terminal is a drain. The specific level values of signals output by each of the power supply terminal and signal terminal may be adjusted according to the requirement of an actual circuit, for example, the level of the first power signal may be 8 volts (V), and the level of the second power signal may be −8V. The power signal of each power supply terminal may be provided by a power management chip outside the display panel, which is not limited in the embodiment of the present disclosure.

The embodiment of the present disclosure provides a display device. The display device may include: a display panel and a gate drive circuit provided by the embodiment of the present disclosure, wherein the gate drive circuit includes a plurality of cascaded shift register units, and the display panel includes pixel circuits correspondingly connected to each shift register unit.

Each pixel circuit is further connected to the first power supply terminal, and is configured to emit light under control of the gate drive signal from the corresponding shift register unit and the first power supply signal from the first power supply terminal.

Optionally, please continue to refer to FIG. 11, each pixel circuit includes: a switching module 50 and a light emitting module 60.

For the switching module 50 and the light emitting module 60 in any one of the pixel circuits, the switching module 50 is connected to the output terminal OUT of the corresponding shift register unit, the first power supply terminal VDD and the light emitting module 60 respectively. The switching module 50 is configured to provide the first power supply signal to the light emitting module 60 under control of the gate drive signal of the corresponding shift register unit.

The light emitting module 60 is connected to the switching module 50 and the second power supply terminal VSS respectively. The light emitting module 60 is configured to emit light under control of the first power supply signal and the second power signal from the second power supply terminal VSS.

In some embodiments, still referring to FIG. 12, the switching module 50 includes: a ninth transistor T9. The light emitting module 60 includes: emitting device L. A gate of the ninth transistor T9 is connected to the output terminal OUT of the corresponding shift register unit, a first electrode of the ninth transistor T9 is connected to the first power supply terminal VDD, and a second electrode of the ninth transistor T9 is connected to one end of the light emitting device L. The other end of the light-emitting device L is connected to the second power supply terminal VSS.

Wherein, the display panel may be: any products or parts with a display function, such as a liquid crystal panel, electronic paper, an organic light-emitting diode (OLED) panel, a mobile phone, a tablet personal computer, a television, a display, a notebook computer, a digital photo frame, a navigator, etc.

The embodiment of the present disclosure further provides a method for controlling the display device. The method may include: controlling a plurality of shift register units to output gate drive signals at the effective potential in a time-sharing fashion, such that the corresponding pixel circuit emits light under control of the gate drive signal and the display panel can display an image.

The embodiment of the present disclosure further provides a storage medium. The storage medium may be a non-volatile computer-readable storage medium, wherein a computer program is stored in the storage medium; and a method for driving the shift register unit, a method for driving the gate drive circuit or a method for controlling the display device, provided by the embodiment of the present disclosure, is implemented when the computer program is executed by a processor.

The above descriptions are merely exemplary embodiments of the present disclosure, and are not intended to limit the present disclosure. Within the spirit and principles of the disclosure, any modifications, equivalent substitutions, improvements, or the like are within the protection scope of the present disclosure.

What is claimed is:

1. A gate drive circuit, comprising a plurality of cascaded shift register units, wherein each of the shift register units is connected to a row of pixel circuits in a display panel; and
   each of the shift register units comprises an output module and is provided with an output terminal, the output module comprising: a drive transistor configured to drive the output terminal to output a gate drive signal, and the output terminal is configured to provide the gate drive signal to a row of pixel circuits connected to a shift register unit provided with the output terminal;
   each of the pixel circuits is further connected to a first power supply terminal and is configured to emit light under control of the gate drive signal from a corresponding shift register unit and a first power supply signal from the first power supply terminal; and
   a width-to-length ratio of a conductive channel of each drive transistor is in negative correlation with a target distance, the target distance being a distance from a corresponding row of pixel circuits to the first power supply terminal.

2. The gate drive circuit according to claim 1, wherein the target distance is represented by a length of a conductive wire for connecting the corresponding row of pixel circuits to the first power supply terminal.

3. The gate drive circuit according to claim 1, wherein the first power supply terminal is disposed at a first end of the display panel; in a near-to-far direction from the first end to a second end, width-to-length ratios of conductive channels of drive transistors in shift register units corresponding to different rows of pixel circuits are gradually reduced; and the first end and the second end are two opposite ends of the display panel.

4. The gate drive circuit according to claim 1, wherein the display panel comprises a plurality of pixel units arranged in an array, each of the pixel units being provided with a pixel circuit, the plurality of pixel units being divided into a plurality of regions, and width-to-length ratios of conductive channels of drive transistors in shift register units connected to pixel circuits in different regions being different.

5. The gate drive circuit according to claim 4, wherein each row of pixel circuits connected to one shift register are arranged in one row of pixel units, and each of the regions comprises at least one row of pixel units.

6. The gate drive circuit according to claim 1, wherein the shift register unit further comprises: an input module, a pull-down control module, and a pull-down module; wherein
   the input module is connected to an input signal terminal, a clock signal terminal, and a pull-up node, respectively, and the input module is configured to provide an input signal from the input signal terminal to the pull-up node under control of a clock signal from the clock signal terminal;

the pull-down control module is connected to the clock signal terminal, the pull-up node, a second power supply end terminal, and a pull-down node, respectively, and the pull-down control module is configured to provide a second power supply signal from the second power supply end terminal to the pull-down node under control of the clock signal, and provide the clock signal to the pull-down node under control of the pull-up node;

the output module is connected to the first power supply terminal, the pull-down node, the pull-up node, a control signal terminal and the output terminal, respectively, and the output module is configured to provide a first power supply signal from the first power supply terminal under control of the pull-down node, and provide a control signal from the control signal terminal to the output terminal under control of the pull-up node; and the pull-down module is connected to the pull-down node, the first power supply terminal, the control signal terminal and the pull-up node, respectively, and the pull-down module is configured to provide the first power supply signal from the first power supply terminal to the pull-up node under control of the pull-down node and the control signal.

7. The gate drive circuit according to claim 6, wherein the input module comprises: a first transistor; wherein a gate of the first transistor is connected to the clock signal terminal, a first electrode of the first transistor is connected to the input signal terminal, and a second electrode of the first transistor is connected to the pull-up node;

the pull-down control module comprises: a second transistor and a third transistor; wherein a gate of the second transistor is connected to the pull-up node, a first electrode of the second transistor is connected to the clock signal terminal, and a second electrode of the second transistor is connected to the pull-down node; and a gate of the third transistor is connected to the clock signal terminal, a first electrode of the third transistor is connected to the second power supply terminal, and a second electrode of the third transistor is connected to the pull-down node;

the output module comprises: a fourth transistor and a drive transistor; wherein a gate of the fourth transistor is connected to the pull-down node, a first electrode of the fourth transistor is connected to the first power supply terminal, and a second electrode of the fourth transistor is connected to the output terminal; and a gate of the drive transistor is connected to the pull-up node, a first electrode of the drive transistor is connected to the control signal terminal, and a second electrode of the drive transistor is connected to the output terminal; and the pull-down module comprises: a sixth transistor and a seventh transistor; wherein a gate of the sixth transistor is connected to the pull-down node, a first electrode of the sixth transistor is connected to the first power supply terminal, and a second electrode of the sixth transistor is connected to a first electrode of the seventh transistor; and a gate of the seventh transistor is connected to the control signal terminal, and a second electrode of the seventh transistor is connected to the pull-up node.

8. A method for driving the gate drive circuit according to claim 1, comprising:

controlling the shift register units to output a gate drive signal at an effective potential in a time-sharing fashion, such that corresponding pixel circuits emit light under control of the gate drive signal.

9. A display device, comprising a display panel and a gate drive circuit, wherein the gate drive circuit comprises a plurality of cascaded shift register units; the display panel comprises a plurality of pixel circuits; and each of the shift register units is connected to a row of pixel circuits in the display panel;

each of the shift register units comprises an output module and is provided with an output terminal, the output module comprising: a drive transistor configured to drive the output terminal to output a gate drive signal, and the output terminal is configured to provide the gate drive signal to a row of pixel circuits connected to a shift register unit provided with the output terminal;

each of the pixel circuits is further connected to a first power supply terminal and is configured to emit light under control of a gate drive signal from a corresponding shift register unit and a first power supply signal from the first power supply terminal; and a width-to-length ratio of a conductive channel of each drive transistor is in negative correlation with a target distance, the target distance being a distance from a corresponding row of pixel circuits to the first power supply terminal.

10. A method for controlling a display device, wherein the display device comprises a display panel and a gate drive circuit, wherein the gate drive circuit comprises a plurality of cascaded shift register units; the display panel comprises a plurality of pixel circuits; and each of the shift register units is connected to a row of pixel circuits in the display panel;

each of the shift register units comprises an output module and is provided with an output terminal, the output module comprising: a drive transistor configured to drive the output terminal to output a gate drive signal, and the output terminal is configured to provide the gate drive signal to a row of pixel circuits connected to a shift register unit provided with the output terminal;

each of the pixel circuits is further connected to a first power supply terminal and is configured to emit light under control of a gate drive signal from a corresponding shift register unit and a first power supply signal from the first power supply terminal;

a width-to-length ratio of a conductive channel of each drive transistor is in negative correlation with a target distance, the target distance being a distance from a corresponding row of pixel circuits to the first power supply terminal; and the method comprises:

controlling the shift register units to output a gate drive signal at an effective potential in a time-sharing fashion, such that corresponding pixel circuits emit light under control of the gate drive signal.

11. The method according to claim 10, wherein the target distance is represented by a length of a conductive wire for connecting the corresponding row of pixel circuits to the first power supply terminal.

12. The gate drive circuit according to claim 2, wherein the first power supply terminal is disposed at a first end of the display panel; in a near-to-far direction from the first end to a second end, width-to-length ratios of conductive channels of drive transistors in shift register units corresponding to different rows of pixel circuits are gradually reduced; and the first end and the second end are two opposite ends of the display panel.

13. The gate drive circuit according to claim 2, wherein the display panel comprises a plurality of pixel units arranged in an array, each of the pixel units being provided with a pixel circuit, the plurality of pixel units being divided into a plurality of regions, and width-to-length ratios of conductive channels of drive transistors in shift register units connected to pixel circuits in different regions being different.

14. The gate drive circuit according to claim 2, wherein the shift register unit further comprises: an input module, a pull-down control module, and a pull-down module; wherein
the input module is connected to an input signal terminal, a clock signal terminal, and a pull-up node, respectively, and the input module is configured to provide an input signal from the input signal terminal to the pull-up node under control of a clock signal from the clock signal terminal;
the pull-down control module is connected to the clock signal terminal, the pull-up node, a second power supply end terminal, and a pull-down node, respectively, and the pull-down control module is configured to provide a second power supply signal from the second power supply end terminal to the pull-down node under control of the clock signal, and provide the clock signal to the pull-down node under control of the pull-up node;
the output module is connected to the first power supply terminal, the pull-down node, the pull-up node, a control signal terminal and the output terminal, respectively, and the output module is configured to provide a first power supply signal from the first power supply terminal under control of the pull-down node, and provide a control signal from the control signal terminal to the output terminal under control of the pull-up node; and
the pull-down module is connected to the pull-down node, the first power supply terminal, the control signal terminal and the pull-up node, respectively, and the pull-down module is configured to provide the first power supply signal from the first power supply terminal to the pull-up node under control of the pull-down node and the control signal.

15. The display device according to claim 9, wherein the target distance is represented by a length of a conductive wire for connecting the corresponding row of pixel circuits to the first power supply terminal.

16. The display device according to claim 9, wherein the first power supply terminal is disposed at a first end of the display panel; in a near-to-far direction from the first end to a second end, width-to-length ratios of conductive channels of drive transistors in shift register units corresponding to different rows of pixel circuits are gradually reduced; and the first end and the second end are two opposite ends of the display panel.

17. The display device according to claim 9, wherein the display panel comprises a plurality of pixel units arranged in an array, each of the pixel units being provided with a pixel circuit, the plurality of pixel units being divided into a plurality of regions, and width-to-length ratios of conductive channels of drive transistors in shift register units connected to pixel circuits in different regions being different.

18. The display device according to claim 17, wherein each row of pixel circuits connected to one shift register are arranged in one row of pixel units, and each of the regions comprises at least one row of pixel units.

19. The display device according to claim 9, wherein the shift register unit further comprises: an input module, a pull-down control module, and a pull-down module; wherein
the input module is connected to an input signal terminal, a clock signal terminal, and a pull-up node, respectively, and the input module is configured to provide an input signal from the input signal terminal to the pull-up node under control of a clock signal from the clock signal terminal;
the pull-down control module is connected to the clock signal terminal, the pull-up node, a second power supply end terminal, and a pull-down node, respectively, and the pull-down control module is configured to provide a second power supply signal from the second power supply end terminal to the pull-down node under control of the clock signal, and provide the clock signal to the pull-down node under control of the pull-up node;
the output module is connected to the first power supply terminal, the pull-down node, the pull-up node, a control signal terminal and the output terminal, respectively, and the output module is configured to provide a first power supply signal from the first power supply terminal under control of the pull-down node, and provide a control signal from the control signal terminal to the output terminal under control of the pull-up node; and
the pull-down module is connected to the pull-down node, the first power supply terminal, the control signal terminal and the pull-up node, respectively, and the pull-down module is configured to provide the first power supply signal from the first power supply terminal to the pull-up node under control of the pull-down node and the control signal.

20. The display device according to claim 19, wherein the input module comprises: a first transistor; wherein
a gate of the first transistor is connected to the clock signal terminal, a first electrode of the first transistor is connected to the input signal terminal, and a second electrode of the first transistor is connected to the pull-up node;
the pull-down control module comprises: a second transistor and a third transistor; wherein
a gate of the second transistor is connected to the pull-up node, a first electrode of the second transistor is connected to the clock signal terminal, and a second electrode of the second transistor is connected to the pull-down node; and
a gate of the third transistor is connected to the clock signal terminal, a first electrode of the third transistor is connected to the second power supply terminal, and a second electrode of the third transistor is connected to the pull-down node;
the output module comprises: a fourth transistor and a drive transistor; wherein a gate of the fourth transistor is connected to the pull-down node, a first electrode of the fourth transistor is connected to the first power supply terminal, and
a second electrode of the fourth transistor is connected to the output terminal; and a gate of the drive transistor is connected to the pull-up node, a first electrode of the drive transistor is connected to the control signal terminal, and a second electrode of the drive transistor is connected to the output terminal; and the pull-down module comprises: a sixth transistor and a seventh transistor; wherein a gate of the sixth transistor is connected to the pull-down node, a first electrode of the sixth transistor is connected to the first power supply terminal, and a second electrode of the sixth transistor is connected to a first electrode of the seventh transistor; and a gate of the seventh transistor is connected to the control signal terminal, and a second electrode of the seventh transistor is connected to the pull-up node.

* * * * *